United States Patent
Priel et al.

(10) Patent No.: US 7,941,716 B2
(45) Date of Patent: May 10, 2011

(54) METHOD FOR RACE PREVENTION AND A DEVICE HAVING RACE PREVENTION CAPABILITIES

(75) Inventors: Michael Priel, Hertzelia (IL); Dan Kuzmin, Givat Shmuel (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 592 days.

(21) Appl. No.: 11/909,394

(22) PCT Filed: Mar. 23, 2005

(86) PCT No.: PCT/IB2005/000756
§ 371 (c)(1),
(2), (4) Date: Sep. 21, 2007

(87) PCT Pub. No.: WO2006/100533
PCT Pub. Date: Sep. 28, 2006

(65) Prior Publication Data
US 2009/0249142 A1 Oct. 1, 2009

(51) Int. Cl.
*G01R 31/3177* (2006.01)
*G01R 31/40* (2006.01)

(52) U.S. Cl. .......................... 714/726; 714/735
(58) Field of Classification Search .................. None
See application file for complete search history.

(56) References Cited

U.S. PATENT DOCUMENTS

| | | | |
|---|---|---|---|
| 4,862,068 A * | 8/1989 | Kawashima et al. | ........ 324/73.1 |
| 6,389,566 B1 | 5/2002 | Wagner et al. | |
| 6,452,433 B1 | 9/2002 | Chang et al. | |
| 6,545,519 B1 | 4/2003 | Carballo | |
| 2001/0035783 A1 | 11/2001 | Kanba | |
| 2002/0135411 A1 | 9/2002 | Hemmert et al. | |
| 2002/0157074 A1 | 10/2002 | Sato | |
| 2004/0015759 A1 | 1/2004 | Chen et al. | |
| 2005/0222795 A1* | 10/2005 | Rodgers et al. | ............... 702/117 |

* cited by examiner

*Primary Examiner* — Cynthia Britt
*Assistant Examiner* — Dipakkumar Gandhi

(57) ABSTRACT

A method for race prevention includes: selectively providing data or scan data to a input latching logic, activating the input latching logic for a first scan mode activation period, introducing a substantial time shift between the first scan mode activation period and a second scan mode activation period, and activating a output latching logic, connected to the input latching logic for a second scan mode activation period. A device having race prevention capabilities includes: an interface logic, a input latching logic, a output latching logic and a control logic. The interface logic is adapted to selectively provide data or scan data to the input latching logic. The control logic is adapted to introduce a substantial time difference between an end point of a first scan mode activation period of the input latching logic and a start point of a second scan mode activation period of the output latching logic.

16 Claims, 5 Drawing Sheets

METHOD FOR RACE PREVENTION AND A DEVICE HAVING RACE PREVENTION CAPABILITIES

FIELD OF THE INVENTION

The present invention relates to devices having race prevention capabilities and to methods for race prevention, especially in scan chains.

BACKGROUND OF THE INVENTION

Modern integrated circuits include a very large amount of logic circuits such as flip-flops, logic gates and the like. These circuits are tested in various manners, in order to provide an indication about the functionality of the integrated circuit.

Integrated circuit designers are force to use relatively limited resources (such as dedicated test pins, silicone footprint) in order to perform complex tests.

One common method for checking an integrated circuit involves connecting multiple scan logic circuits in a serial manner, such as to form a very long scan chain. A typical scan logic circuit can operate in a functional mode and in scan mode. In scan mode scan data propagates along the scan chain, from one scan logic circuit to another scan logic circuit. In functional mode data propagates between logic circuits in paths that differ from the scan data paths.

Signals, such as clock signals and data signals propagate differently during scan mode and functional mode, as they travel through different paths. A clock signal can be skewed and even dramatically skewed in one mode while being substantially un-skewed in the other operational mode.

Clock skews can cause timing violations such as setup or hold violations. These violations can cause scan data to be corrupted and even force a scan logic circuit to enter un unknown logical state.

FIG. 1 illustrates a portion 10 of a prior art scan chain. Portion 10 includes two flip-flops 20 and 30, two multiplexers (denoted MUX) 40 and 50, and two boxes 60 and 70 that represent combinational logic that form a part of the functional path. The latter are various logic circuits that are connected to flip flop 20 and 30 during functional mode.

Each multiplexer has a data input, a scan data input and a control input that receives a S/F mode signal indicating whether the portion 10 operates in scan mode or functional mode. In response multiplexer 40 and 50 provide data or scan data to the input of the flip flops 20 and 30.

Flip flop 20 receives a first clock signal CLK1 81 while flip flop 30 receives a second clock signal CLK2 82.

Flip flop 20 includes an input transfer gate 22, an input latch 24, an intermediate transfer gate 26 and an output latch 28. Flip flop 30 includes an input transfer gate 32, an input latch 34, an intermediate transfer gate 36 and an output latch 38. Input transfer gate 22 is opened when CLK1 81 is low and output transfer gate 28 is opened when clock signal CLK1 81 is high. Input transfer gate 32 is opened when CLK2 82 is low and output transfer gate 38 is opened when clock signal CLK2 82 is high.

In order to ensure proper operation of flip flops 20 and 30 the output signal from flip flop 20 must be steady for a set up period before the rising edge of CLK2 82 and be steady for a hold period after the rising edge of CLK2.

The output signal of flip flop 20 is steady after the falling edge of CLK1 81 and can also be steady in response to the behavior of the signal provided to it from the input latch 24.

If there is a negligible time difference between CLK1 81 and CLK2 82 the timing conditions can be maintained. On the other hand, if there is a substantial skew between CLK1 and CLK 2 the timing conditions are not maintained. A race occurs when the timing differences result in timing violations, and especially when a certain scan flip flop samples irrelevant information.

Various techniques were applied in order to reduce these timing violation. A first technique provides a delay circuit in the scan mode path. The delay period of the delay circuit resembles a delay introduced by the functional mode path. U.S. patent application publication number 2004/0015759 of Chen et al., which is incorporated herein by reference provides such a solution. Another technique extended the time period required to change a state of a scan logic circuit by providing a weak scan output signal driver. U.S. Pat. No. 6,389,566 of Wagner et al., which is incorporated herein by reference, provides such a solution. Yet a further technique involves simulating the performance of the scan chain and re-designing the connectivity between scan logic circuits until proper scan chain performance is achieved.

There is a need to provide an efficient method for race prevention, and a device that has race prevention capabilities, especially in scan chains.

SUMMARY OF THE PRESENT INVENTION

A method for race prevention and a device that has race prevention capabilities, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

Figure 1:
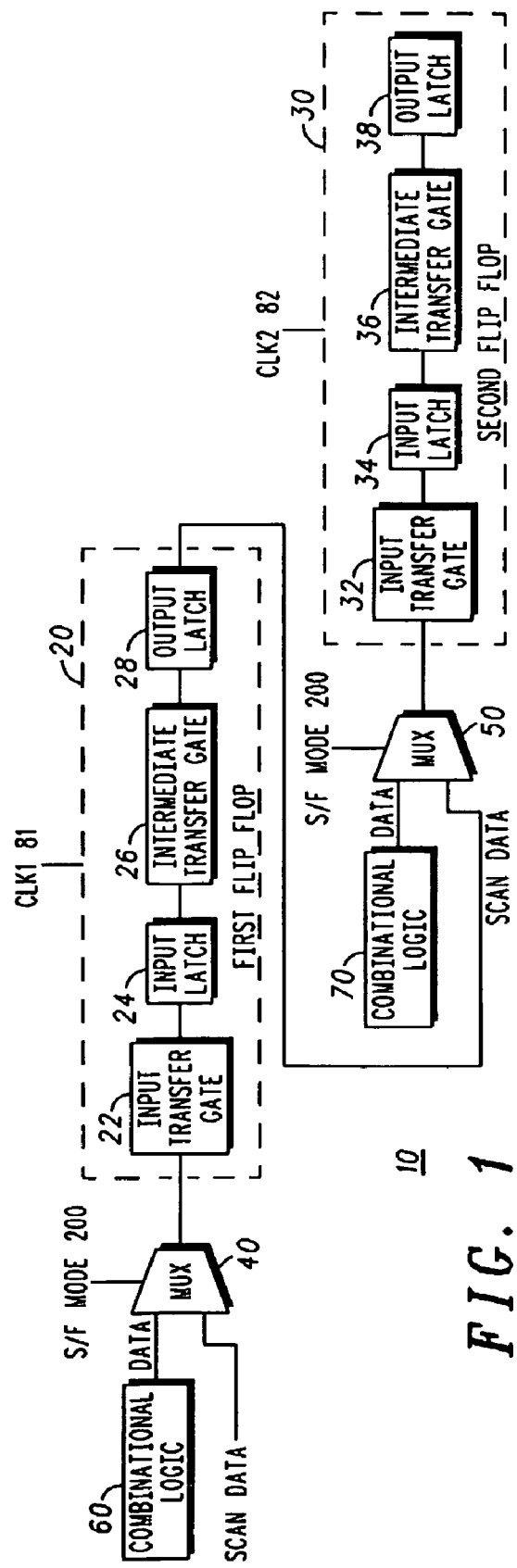
FIG. 1 illustrates a portion of a prior art scan chain.
Figure 2:
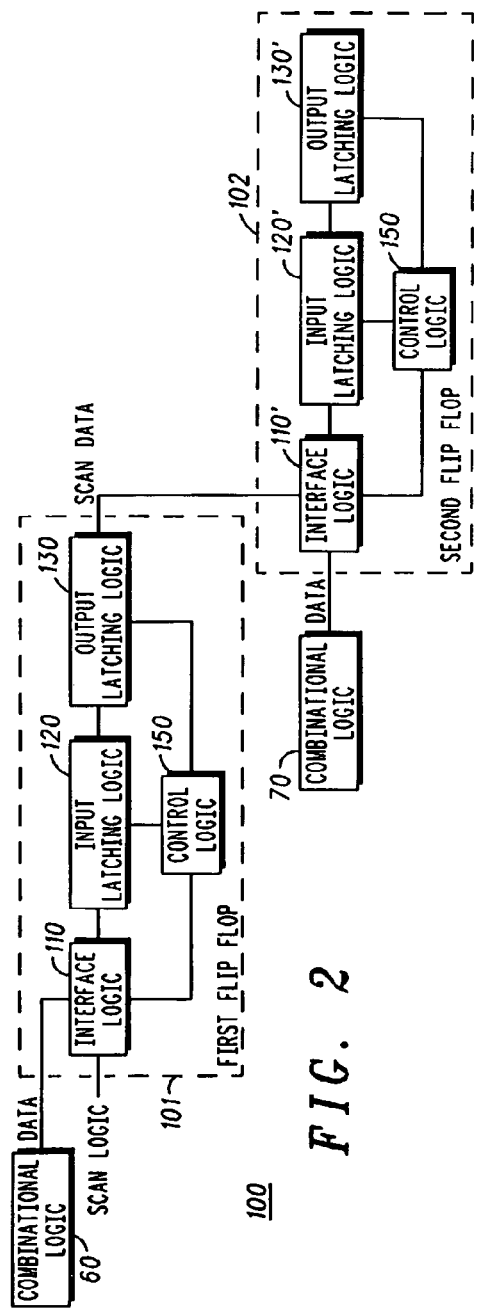
FIG. 2 illustrates a device, according to an embodiment of the invention.

FIG. 2 illustrates a device 100, according to an embodiment of the invention. Device 100 can be an integrated circuit, a system on chip, a mobile device such as but not limited to a cellular phone, a personal data accessory, a computer, and the like. Device 100 includes many logic circuits and some of these circuits are connected in one or more scan chains.

FIG. 2 illustrates only two flip flops 101 and 102, although device 100 can include a very large amount of scan flip flops.

The first flip flop 101 includes interface logic 110, an input latching logic 120, an output latching logic 130 and a control logic 150. Logics 110, 120 and 130 are connected in a serial manner while control logic 150 is connected to the input and output latching logic 120 and 130.

A second flip flop 102 includes substantially the same logics, but is fed by another clock signal. The second flip flop 102 includes interface logic 110', an input latching logic 120', an output latching logic 130' and a control logic 150'. Logics 110', 120' and 130' are connected in a serial manner while control logic 150' is connected to the input and output latching logic 120' and 130'.

In scan mode input latching logic 120 is activated during a first scan mode activation period SMAP1, output latching logic 130 is activated during a second scan mode activation period SMAP2, input latching logic 120' is activated during a third scan mode activation period SMAP3, output latching logic 130' is activated during a fourth scan mode activation period SMAP4.

Conveniently, SMAP 1 and SMAP 2 do not overlap and SMAP 3 and SMAP 4 do not overlap. Usually, due to clock skew, SMAP 1 and SMAP2 start at different time, and SMAP2 and SMAP 4 start at different times.

It is noted that many iterations of SMAP1-SMAP4 occur during a single scan test. Typically, the amount of iterations is responsive to the length of a scan chain through which scan data propagates. If, for example the scan chain includes N scan flip flops then the scan test can include N iterations of SMAP1 and SMAP2 (as well as of SMAP3 and SMAP4).

The interface logic 110 provides, during scan mode, scan data from an pervious scan flip flop or from another component, such as test device that provides test signals via a test pin. The interface logic 110 provides data from logic 60 during functional mode.

Figure 5:
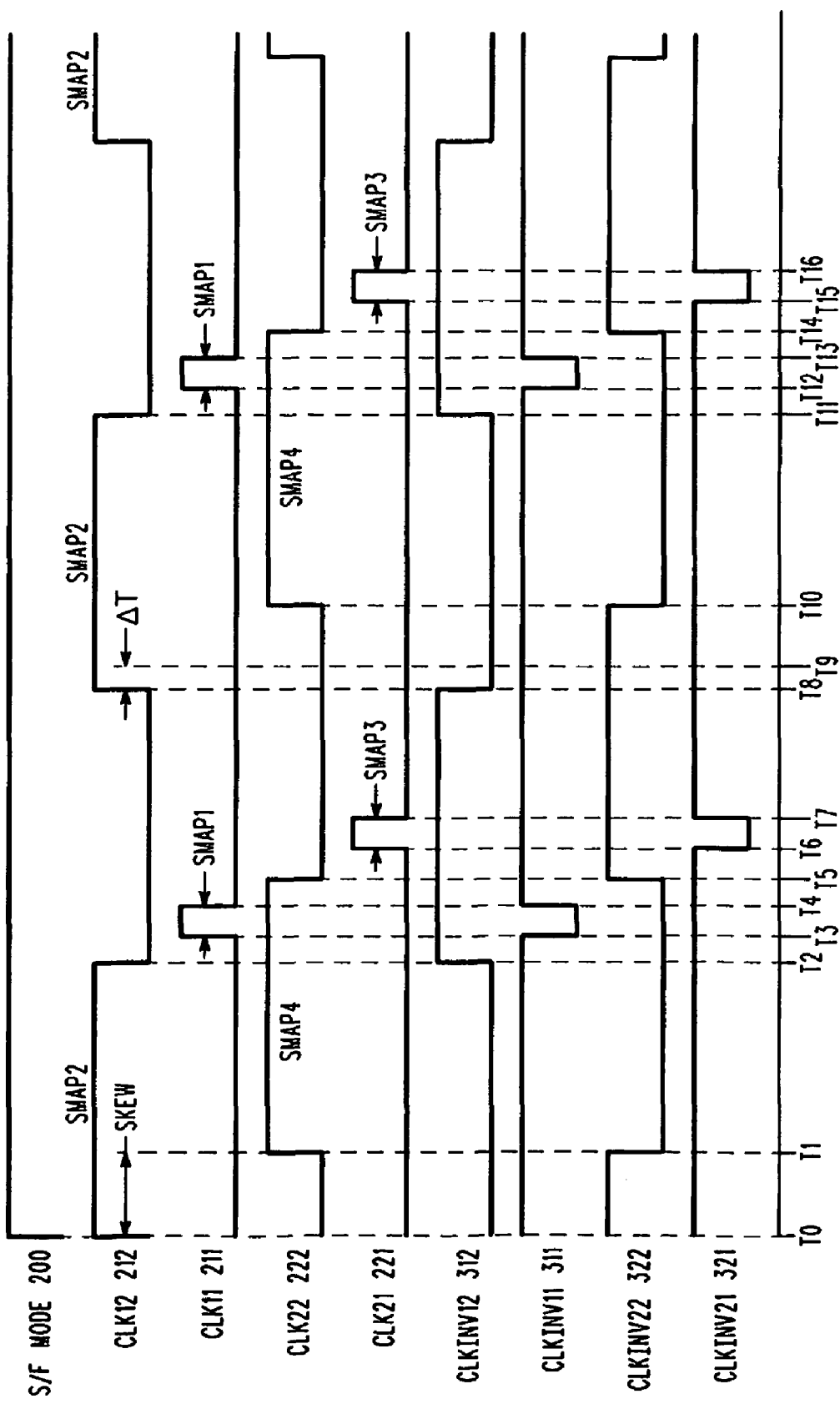
FIG. 5 is a timing diagram illustrating various control signals, according to an embodiment of the invention.

Interface logic 110 receives a control signal S/F mode 200 and optionally its complementary signal S/F_inv mode 300. Each control signal indicates whether flip flops 101 and 102 operate in scan mode or operate in functional mode. These control signals are illustrated in FIG. 5.

Interface logic 110' of second flip flop 102 provides scan data from the first flip flop 101 during scan mode and provide data from combinational logic 70.

Control logic 150 introduces a substantial time difference between an end point of a SMAP1 and between a start point of SMAP2. Control logic 150' introduces the substantial time difference between an end point of a SMAP3 and between a start point of SMAP4.

Conveniently, SMAP1 (and SMAP3) is relatively short. Its length is determined by control logic 150 (and control logic 150') and especially in response to a delay introduced by a delay logic within the control logic.

Conveniently, the length of SMAP 1 and SMAP3 is determined in response to the timing characteristics of input logics 120 and 120' respectively. For example, SMAP1 has to be longer than a time period that is required for receiving an input scan data signal and providing a stabilized signal at the output of input logic 120.

According to an embodiment of the invention the substantial time difference is responsive to expected clock skew. The clock skew can be measured, calculated and/or simulated. Once the clock skew is determined the control logic 150 can be designed or configured.

Conveniently, the substantial time difference is longer than SMAP1 and than SMAP3. Typically, the substantial time difference is a fraction of the clock cycle. Conveniently, this fraction is below 50% of the clock cycle but above 25% of the clock cycle. The inventors used a substantial time difference of about 40% of the clock cycle.

According to an embodiment of the invention the control logic 150 is capable of providing functional mode activation periods that differ from SMAP1-SMAP4. Conveniently, the functional mode activation periods of the input and output logics 120 and 130 (As well as 120' and 130') can have the same length. Conveniently, the control logic 150 (and control logic 150') introduces the substantial time difference only during scan mode.

According to an embodiment of the invention each flip flop is controlled by a single control logic such as control logics 150 and 150'. Conveniently, the control logic is a part of each flip flop.

According to other embodiments of the invention a single control logic can control multiple flip-flops. For example control logic 150 can control both first and second flip flops 101 and 102, or even additional flip flops (not shown).

Figure 3:
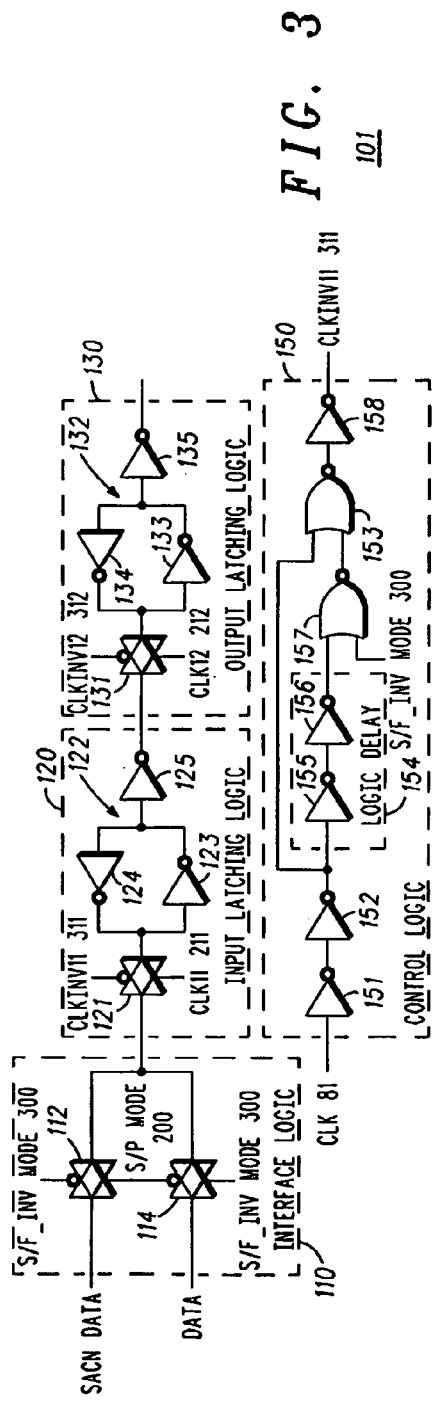
FIG. 3 illustrates a flip flop, according to an embodiment of the invention.

FIG. 3 illustrates in better details a flip flop such as first flip flop 101, according to an embodiment of the invention.

Interface logic 110 includes a first transfer gate 112, and a second transfer gate 114. Input latching logic 120 includes a third transfer gate 121, a input latch 122 that includes a feed forward inverter 123 and a feed backward inverter 124, and a third inverter 125. The third transfer gate 121 transfers a signal (such as data or scan data) provided by the interface logic 110 to the input latch 122. The output of the input latch 122 is connected to the input of the third inverter 125 while the output of the third inverter 125 is connected to the input of the output latching logic 130.

The control logic 150 receives clock signal CLK1 81 and during scan mode provides control signals CLK11 211 and CLK12 212 as well as their complementary control signals CLKinv11 311 and CLKinv12 312.

Conveniently, during functional mode the control logic 150 provides to the input and output latching logics 120 and 130 control signals that are substantially equal to CLK1 81 and its complementary control signal CLKlinv 181.

The third transfer gate 121 is controlled by control signal CLK11 211 and its complementary control signal CLKinv11 311. Both control signals are provided by control logic 150. SMAP1 starts at a rising edge of CLK11 211 and ends at the falling edge of CLK11 211.

The output latching logic 130 includes a fourth transfer gate 131, a output latch 132 that includes a feed forward inverter 133 and a feed backward inverter 134, and a second inverter 135. The fourth transfer gate 131 transfers a signal (data or scan data) from the output of the first inverter 125 to the output latch 132 during SMAP3. The output of output latch 132 is connected to the input of second inverter 135 while the output of second inverter 135 provides an output port of flip flop 101.

The fourth transfer gate 131 is controlled by a control signal CLK12 212 and its complementary control signal CLKinv12 312. Both control signals are provided by control logic 150. SMAP2 starts at a rising edge of CLK12 212 and ends at the falling edge of CLK12 212.

Control logic 150 includes a cascade of two control logic inverters 151 and 152. The output of control logic inverter 152 is connected to a first input of first NOR gate 153 and to an input of a delay logic 154. The delay logic can include multiple inverters such as delay inverters 155 and 156 that are serially connected to each other. The output of delay logic 154 is connected to a first input of second NOR gate 157. A second input of second NOR gate 157 receives an inverted control signal S/F_inv mode 300.

The output of the second NOR gate 157 is connected to the second input of the first NOR gate 153. The output of the first NOR gate 153 provided signal CLK11 211. The output of the first NOR gate 153 is connected to a control logic output inverter 158 that provides control signal CLKinv11 311.

In scan mode, The control logic 150 provides a short CLK11 211 pulse. This short pulse defines the length of SMAP1. The substantial time difference between SMAP1 and SMAP2 is substantially equal to the time difference between the length of half of the clock cycle (CLK1) and between the duration of SMAP1.

The second flip flop 102 has the same configuration as flip flop 101. For simplicity of explanation flip flop 102 is represented by interface logic 110', input latching logic 120' and output latching logic 130'. Second flip flop 102 has a control logic 150' that receives a clock signal CLK2 82 and provides, at least during scan mode, control signals CLK21 221, CLK22 222 and their complementary control signals CLKinv21 321 and CLKinv22 322.

Interface logic 110 includes a first and a second transfer gates 112 and 114. The first transfer gate 112 can receive scan data (SD) while the second transfer gate 114 can receive data. The first and second transfer gates 112 and 114 are fed by control signal S/F mode 200 and S/F_inv mode 300 such that the first transfer gate 112 is opened during scan mode while the second transfer gate 114 is opened during a functional mode. The outputs of both input transfer gates 112 and 114 are connected in parallel to the input of the third transfer gate 121.

Figure 4:
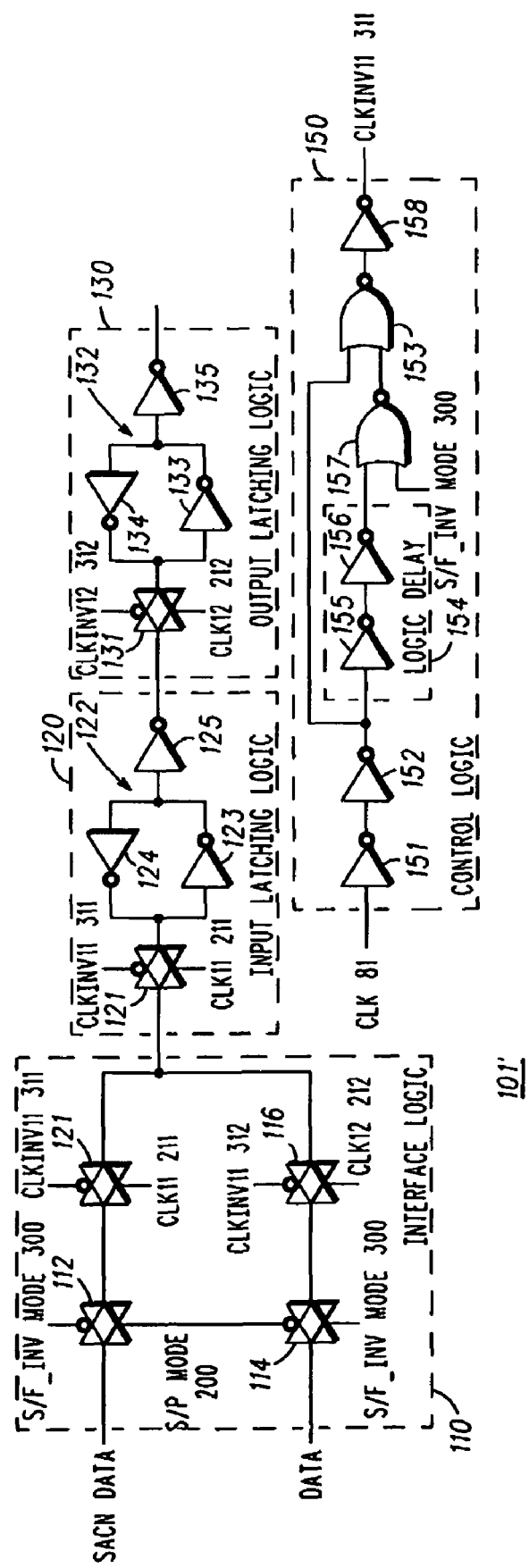
FIG. 4 illustrates a flip flop, according to another embodiments of the invention.

FIG. 4 illustrates in better details a flip flop such as first flip flop 101', according to another embodiment of the invention.

First flip flop 101' differs from flip flop 101 of FIG. 3 by having an additional transfer gate 116. In addition, various transfer gates are connected in a different manner than the connections that are illustrated in FIG. 3.

The output of the first transfer gate 112 is connected to the input of the third transfer gate 121. The output of the second transfer gate 114 is connected to the input of the additional transfer gate 116. The outputs of the additional transfer gate 116 and the third transfer gate 121 are connected to input latch 122.

The additional transfer gate 116 is controlled by control signal CLK12 212 and by CLKinv12 312.

FIG. 5 is a timing diagram of various clock signals provided to the first and second flip flops 101 and 102, according to an embodiment of the invention.

For simplicity of explanation various delays introduced by various logic gates and inverters were not taken into account. It is assumed that CLK 81 equals CLK12 212, that CLK2 82 equals CLK22 222 and that there is a skew of (T1-T0) between CLK1 81 and CLK2 82.

It is noted that the illustrated timing diagram shows a clock skew that is longer than the duration of SMAP1, and that SMAP1 ends before SMAP3 ends, but this is not necessarily so.

At T0 CLK12 212 is asserted. At T1, after a skew period of T1-T0 control signal CLK22 222 is asserted. At T2 CLK 12 212 is negated. SMAP2 starts at T0 and ends at T2. During SMAP2 output latching logic 130 is active—it can change its state in response to signals that are provided by input latching logic 120 after a previous SMAP1 (not shown) ended.

At T3, shortly after CLK21 221 is negated, the control logic 150 asserts control signal CLK11 211. This control signal is negated at T4, after a short while. SMAP1 starts at T3 and ends at T4. The time difference between T2 and T3 results from a delay that is introduced by control logic inverters 151 and 152. The length of SMAP1 is responsive to the delay introduced by delay logic 154.

After CLK11 211 is negated the input latching logic 120 does not alter its output signal. Thus, during a substantially long period that ends at T11, the output latching logic 130 receives a steady signal.

At T5 CLK22 222 is negated. SMAP4 starts at T1 and ends at T5. Accordingly, output latching logic 130' is active during SMAP4.

At T6, shortly after CLK22 222 is negated, control logic 150' asserts control signal CLK21 221. This control signal is negated at T7, after a short period. SMAP3 starts at T6 and ends at T7. During that short SMAP3 input latching logic 120' can receive the scan data provided from the output latching logic 130.

After SMAP3 ends the input latching logic 120' does not alter its output signal. Thus, during a substantially long period, that ends at T14 the output latching logic 130' receives a steady signal.

Furthermore, assuming that the output latching logic 130 can provide a stable output signal after a short period ΔT, then ΔT after the beginning of SMAP2 (for example at T9) it provides a stable signal to input latching logic 120'. As can be seen from FIG. 4 there is a substantial time difference between T9 and T12 in which a new SMAP3 begins. Thus, even a skewed signal does not cause timing violations.

According to another embodiment of the invention the output latching logic is also activated during a short period. It can be controlled by a signal that has substantially the same shape of CLK11 211, but is delayed by substantially half a clock cycle. Such a clock signal can be generated by the control logic such as 150 that include delay elements at its output.

Figure 6:
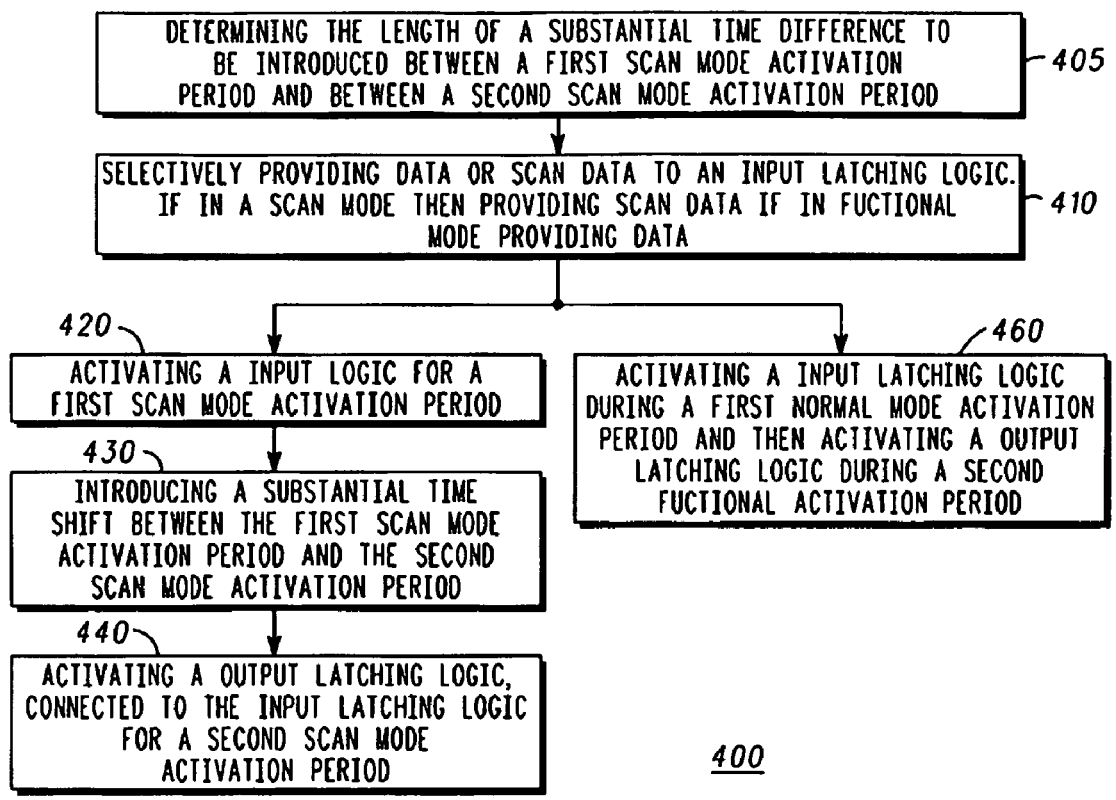
FIG. 6 is a flow chart of a method for race prevention, according to an embodiment of the invention.

FIG. 6 is a flow chart of method 400 for race prevention, according to an embodiment of the invention.

Method 400 can start by stage 405 of determining the length of a substantial time difference to be introduced between a first scan mode activation period and between a second scan mode activation period. Stage 405 is usually a part of the design process of device 10. Conveniently, the substantial time period is responsive to an expected clock skew, and is conveniently longer than said skew.

Stage 405 is followed by various stages that are usually applied during the operation of the device. These stages are usually applied during a scan mode and/or functional mode of the device.

Stage 410 includes selectively providing data or scan data to a input latching logic. Assuming that the device operates in a scan mode then stage 410 includes providing scan data and jumping to stage 420.

Stage 420 includes activating a input latching logic for a first scan mode activation period. Conveniently, multiple input latching logics are activated. Usually due to timing differences the input latching logics are activated during SMAPs that differ from each other, although different SMAPs at least partially overlap.

Stage 420 is followed by stage 430 of introducing a substantial time shift between the first scan mode activation period and the second scan mode activation period.

Stage 430 is followed by stage 440 of activating a output latching logic, connected to the input latching logic for a second scan mode activation period.

Conveniently, multiple input latching logics are activated. Usually due to timing differences the output latching logics are activated during SMAPs that differ from each other, although different SMAPs at least partially overlap.

Conveniently, stages 410-440 are repeated until scan data propagates through an entire scan chain, or through a predefined portion of the scan chain. During each iteration of stages 420-440 scan data propagates through multiple scan flip flops. Conveniently, a input latching logic of a certain scan flip flop receives the output data provided from a output latching logic of a preceding scan flip flop.

Conveniently, the substantial time shift compensates for clock skews.

Conveniently, the first scan mode activation period is short. Conveniently, the substantial time difference is longer than the first scan mode activation period.

Referring back to FIG. 4, when the device operates at a functional mode stage 410 includes providing data and jumping to stage 460. Stage 460 includes activating a input latching logic during a first normal mode activation period and then activating a output latching logic during a second functional activation period. Conveniently, the first and second functional mode activation periods are equal to each other, but this is not necessarily so. These periods can be responsive to functional mode timing constraints.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device comprising:
   an interface logic, an output latching logic and an input latching logic that is coupled between the interface logic and the output latching logic, the interface logic is configured to selectively provide data or scan data to the input latching logic;
   a control logic comprising:
      an input;
      an output coupled to an input of the input latching logic;
      the control logic configured to:
         in a functional mode of operation, delay a clock signal received at the input by a first delay to provide a first delayed clock signal at the output; and
         in a scan mode of operation, introduce a substantial time difference between an end point of a first scan mode activation period of the input latching logic and a start point of a second scan mode activation period of the output latching logic by delaying the clock signal received at the input by a second delay to provide a second delayed clock signal at the output; and
      wherein the control logic is configured to control multiple input latching logics and multiple output latching logics.

2. The device according to claim 1 wherein the control logic is configured to activate the input latching logic for a short first scan mode activation period.

3. The device according to claim 1 wherein the substantial time difference is responsive to expected clock skew between a first clock signal provided to the input latching logic and a second clock signal provided to another input latching logic, wherein an output of the output latching logic is coupled to an input of another interface logic, wherein an output of the other interface logic is coupled to an input of the other input latching logic.

4. The device according to claim 3 wherein the substantial time difference is longer than the first scan mode activation period.

5. The device according to claim 3 wherein the mode of operation is indicated to the control logic by an operational mode control signal.

6. The device according to claim 3 wherein the control logic comprises a delay module coupled to the input and a first NOR gate comprising a first input coupled to an output of the delay module, a second input to receive an operational mode control signal indicating the mode of operation, and an output.

7. The device according to claim 6 wherein the control logic further comprises a second NOR gate comprising an input coupled to the input of the control logic, an input coupled to the output of the first NOR gate, and an output coupled to the output of the control logic.

8. The device according to claim 3 wherein the input latching logic and the output latching logic form a scan flip flop.

9. A method for race prevention, the method comprises:
   selectively providing data or scan data to a input latching logic;
   in response to determining a mode of operation is a scan mode:
      activating the input latching logic for a first scan mode activation period;
      activating an output latching logic, coupled to the input latching logic for a second scan mode activation period;
      introducing a substantial time shift between the first scan mode activation period and the second scan mode activation period by delaying a clock signal received at an input of control logic by a first delay to provide a first delayed clock signal to the input latching logic;
      whereas the activating comprises activating multiple input latching logics; whereas the activating comprises activating multiple output latching logics; and
      whereas the multiple input latching logics and the multiple output latching logics are controlled by the control logic, and
   in response to determining the mode of operation is a functional mode:
      delaying the clock signal received at the input of the control logic by a second delay to provide a second delayed clock signal to the input latching logic.

10. The method according to claim 9 wherein the first scan mode activation period is short.

11. The method according to claim 9 further comprising determining a substantial time difference in response to an expected clock skew between a first clock signal provided to the input latching logic and a second clock signal provided to another input latching logic, wherein an output of the output latching logic is coupled to an input of another interface logic, wherein an output of the other interface logic is coupled to an input of the other input latching logic.

12. The method according to claim 11 wherein the substantial time difference is longer than the first scan mode activation period.

13. The method according to claim 11 wherein the control logic is responsive to a clock signal and to an operational mode control signal.

14. The method according to claim 11 wherein the first delay is larger than the second delay.

15. The method according to claim 11 wherein the control logic comprises a delay module coupled to the input and a first NOR gate comprising a first input coupled to an output of the delay module, a second input to receive an operational mode control signal indicating the mode of operation, and an output.

16. The method according to claim 11 wherein the input latching logic and the output latching logic form a scan flip flop.

* * * * *